(12) United States Patent
Logisch

(10) Patent No.: US 6,759,854 B2
(45) Date of Patent: Jul. 6, 2004

(54) TEST APPARATUS FOR TESTING DEVICES UNDER TEST AND METHOD FOR TRANSMITTING A TEST SIGNAL

(75) Inventor: Andreas Logisch, München (DE)

(73) Assignee: Infineon Technologies, Munich (DE)

( * ) Notice: Subject to any disclaimer, the term of this patent is extended or adjusted under 35 U.S.C. 154(b) by 59 days.

(21) Appl. No.: 10/208,350

(22) Filed: Jul. 30, 2002

(65) Prior Publication Data

US 2003/0030427 A1 Feb. 13, 2003

(30) Foreign Application Priority Data

Jul. 30, 2001 (DE) .......................................... 101 37 128

(51) Int. Cl.[7] .............................................. G01R 27/04
(52) U.S. Cl. .......................... 324/629; 324/84; 324/95; 324/158.1; 324/543; 324/759; 324/763
(58) Field of Search .............................. 324/629, 158.1, 324/707, 543, 84, 94, 763, 764, 765, 126, 127, 128, 537, 750, 755, 759, 95; 326/62; 327/170, 551; 714/25, 724, 699

(56) References Cited

U.S. PATENT DOCUMENTS

| | | | |
|---|---|---|---|
| 5,086,271 A | | 2/1992 | Haill et al. ................ 324/158.1 |
| 6,133,725 A | * | 10/2000 | Bowhers ................... 324/158.1 |
| 6,275,023 B1 | * | 8/2001 | Oosaki et al. ............. 324/158.1 |
| 6,448,800 B1 | * | 9/2002 | Yamamoto et al. ......... 324/763 |
| 6,617,844 B2 | * | 9/2003 | Lambert ................... 324/158.1 |
| 6,617,871 B2 | * | 9/2003 | Stark ......................... 324/765 |

OTHER PUBLICATIONS

James, J. et al.: "Handbook of Microstrip Antennas", vol. 2, pp. 850–852.

* cited by examiner

Primary Examiner—Andrew H. Hirshfeld
Assistant Examiner—Minh Chau
(74) Attorney, Agent, or Firm—Laurence A. Greenberg; Werner H. Stemer; Gregory L. Mayback

(57) ABSTRACT

A test apparatus comprises an input for receiving a test signal from a test signal source, wherein a signal line with a predefined characteristic wave impedance can be connected to the input. The test apparatus further comprises branching means with a first and a plurality of second terminals, the first terminal being connected to the input. The test apparatus further comprises a plurality of distribution lines, wherein each distribution line is connected to one of the plurality of second terminals of branching means, wherein one of the devices under test can be connected to each distribution line at the output side, each distribution line having a characteristic wave impedance, which is substantially equal to the product of the predefined characteristic wave impedance of the signal line and the number of distribution lines. Thus, a signal matching is given at the branching point, so that no amplitude or signal rise time distortions of the excitation signals occur at the inputs of the devices under test.

8 Claims, 3 Drawing Sheets

DUT 1
rise time 1.7 ns

DUT 2
rise time 1.25 ns

DUT (FIG 2)
rise time 1.17 ns

TEST APPARATUS FOR TESTING DEVICES UNDER TEST AND METHOD FOR TRANSMITTING A TEST SIGNAL

FIELD OF THE INVENTION

The present invention refers to the testing of devices under test and particularly to the simultaneous testing of a plurality of devices under test.

BACKGROUND OF THE INVENTION AND PRIOR ART

FIG. 2 shows a typical diagram of a test setup for testing a device under test or a device under test (DUT), which can for example be an integrated circuit. The setup consists of a system 200 with an output 210 for a test signal. The test signal is transmitted via a signal line 220 to an input 230 of a device under test, which can be an integrated circuit, for example. In response to the test signal of the test system 200 transmitted via signal line 220, the device under test provides a result signal at an output 214, that can either be received with the test system 200 or with another analytical instrument (not shown in FIG. 2).

It is the disadvantage of the system illustrated in FIG. 2, that only one device under test 250 can be measured at a time. When a high throughput is desired, this leads to the fact that either many expensive test systems have to be purchased, or that the test time has to be decreased, which can affect the test quality.

FIG. 3 shows a known possibility for increasing the test throughput with the same number of test systems. The test system 200 is again coupled to the signal line 220 with its test signal output 210, the signal line 220 having a characteristic wave impedance of 50 Ω, for example. The signal line 220 is not directly coupled to an input of a device under test as in FIG. 2, but is coupled to a first line 300. To increase the throughput, two devices under test (DUT1 and DUT2) will be connected to a line 300. As it is shown in FIG. 3, a so called L-configuration is used, such that device under test DUT1 is directly connected to line 300, while a second line 320 is attached directly before an input 310 of device under test DUT1 or immediately at the input 310 of device under test DUT1, and an input 330 of the second device under test DUT2 is electrically connected to the second line.

The concept shown in FIG. 3 can basically be extended for any number of devices under test (DUT1 ... DUTn). The signal of a tester channel will thus be lead to two or more components to be tested to test with limited channel number of the test system as many components as possible.

It is a disadvantage of the system in FIG. 3, that the signal rise time of a test signal is decreased. This is due to the reflection of a signal at the input 330 of the DUT2. Typically, the inputs of an integrated circuit to be tested have a high impedance. This means that a wave propagating on the first line 300 designated by a row 350a does not notice the input 310 of device under test 1, but propagates along the second line 330, since both the first line and the second line have a characteristic wave impedance of 50 Ω. The propagation of the wave along the second line 320 is illustrated by arrow 350b. However, the 50-Ω-line 320 matched to the signal line is ending at the input 330 of the device under test. This means that a total reflection of the wave occurs at the high impedance input 330 of the second device under test, as it is illustrated by arrow 350c. The totally reflected wave superimposes on the first line 300 of the propagating wave. The back propagating wave, i.e. the totally reflected wave on line 300, is symbolically illustrated by arrow 350d.

With regard to the voltage amplitude at the input of the first device under test this has the following effects. First, when the wave 350a propagates to the device under test 1, half of the programmed amplitude is applied to device under test 1. When then the wave 350c reflected from the input 330 of the second device under test reaches the input of device under test 310 again, propagating and back propagating waves superimpose, so that the amplitude at the input of the first device under test reaches the programmed value. The time wave form of the signal applied to the input 310 of the first device under test thus corresponds to a staircase curve. Due to the half amplitude of the propagating wave that is not yet superimposed with the totally reflected wave unwanted conditions occur at the input of device under test 310, since the amplitude of the propagating wave is in proximity to the switching threshold of the device under test. Only when the totally reflected wave is at the input 310, the fully programmed amplitude will be achieved. This staircase curve leads immediately to unwanted results of the first device under test DUT1, i.e. DUT1 might be detected as defective although it is alright. It should be noted, that the staircase curve is only visible with a certain timely resolution when the subline 320 has a certain length. With smaller lengths, the staircase curve is smoothed to a flatter rising edge.

Thus, in the so called L-shared-solution shown in FIG. 3 significant signal distortions occur at the component inputs with regard to amplitude and rise time that make testing with defined wave forms more difficult or even impossible, and typically lead to a much too high number of fail results, respectively, although these devices under test function correctly and would have "deserved" a "pass".

To avoid these reflection problems the usage of a passive resistor network could be considered. This, however, reduces the voltage amplitude and therefore restricts the useable amplitude area of the tester. Above that, by the imposed necessary connection to a signal mass, a leakage current measurement at the inputs of devices under test becomes impossible.

SUMMARY OF THE INVENTION

It is the object of the present invention to provide a test apparatus as well as a method for transmitting a test signal to devices under test, that lead to more accurate test results and particularly provide more accurate statements about the fact whether a device under test is alright or defective.

In accordance with a first aspect of the invention, this object is achieved by a test apparatus for testing devices under test, comprising: an input for receiving a test signal from a test signal source, wherein a signal line with a predefined characteristic wave impedance is connectable to the input; branching means with a first and a plurality of second terminals, the first terminal being connected to the input; and a plurality of distribution lines, each distribution line of the plurality of distribution lines being connected to one of the plurality of second terminals on the input side, and wherein one of the devices under test is connectable to each distribution line on an output side, wherein each distribution line has a characteristic wave impedance which is substantially equal to a product of the predefined characteristic wave impedance and the number of distribution lines.

In accordance with a second aspect of the invention this object is achieved by a method for transmitting a test signal to devices under test, comprising: receiving a test signal from a signal line having a predefined characteristic wave impedance; branching the testing signal into a number of branching signals; transmitting the branching signals via a number of distribution lines, wherein each distribution line has a characteristic wave impedance that is substantially equal to a product of the predefined characteristic wave impedance and the number of distribution lines.

The present invention is based on the knowledge that for increasing the throughput on the one hand more devices under test have to be connected to a test system, and that, on the other hand, a matching has to be carried out at the branching point where the test signal of the test system is divided into several test signals to the several devices under test, so that no reflection problems will be caused. The inventive test apparatus comprises an input for receiving a test signal from a test signal source, wherein a signal line with a predetermined characteristic wave impedance is connectable to the input, branching means with a first and a plurality of second terminals, wherein the first terminal is connected to the input, and a plurality of distribution lines, wherein each distribution line is connected to a plurality of second terminals on the input side, and wherein one of the device under test can be connected to each distribution line on the output side. Inventively, each distribution line has a characteristic wave impedance, which is substantially equal to the product of the predefined characteristic wave impedance and the number of distribution lines.

Thus it is made sure that a matching is present at the branching point, so that a test signal is not reflected at the branching point and reaches the devices under test without reflection losses. Above that, it is made sure by the matching in the branching point that signals reflected back from the devices under test are not reflected at the branching point and come again into the devices under test, which would cause a staircase curve of the excitation signal. Instead, a signal reflected back from the devices under test is immediately reflected back into the test system and absorbed there by the internal resistance without interfering with the measurement.

It is therefore the advantage of the present invention that due to the test setup for a plurality of devices under test no amplitude or rise time distortions occur. This again leads to the fact that no devices under test that are actually alright are detected as defective, as it is the case with the known L-shared-solution.

BRIEF DESCRIPTION OF THE DRAWINGS

Preferred embodiments of the present invention will be discussed in more detail below with reference to the accompanying drawings. They show.

DETAILED DESCRIPTION OF PREFERRED EMBODIMENTS

Figure 1:
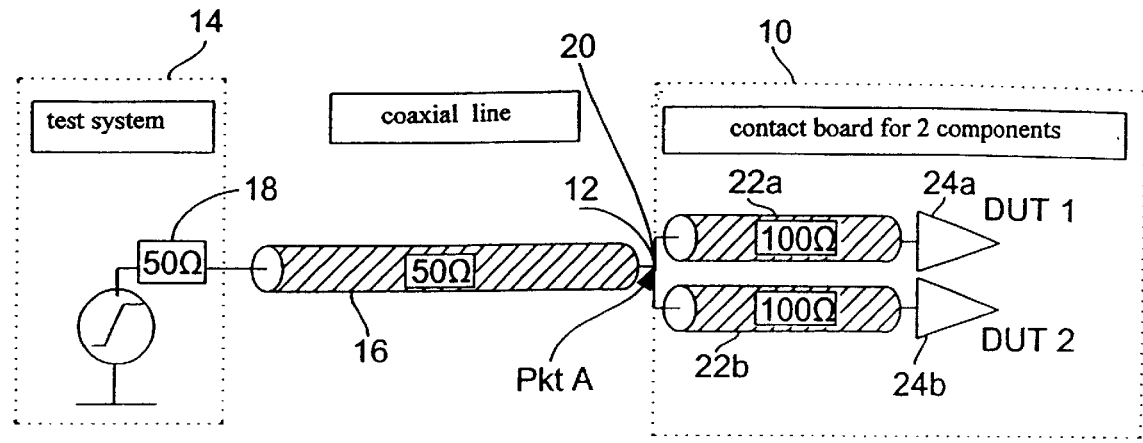
FIG. 1 a block diagram of an example for an inventive test apparatus.

FIG. 1 shows an embodiment for an inventive test apparatus 10 in FIG. 1, also referred to as contact board for two components. The test apparatus 10 comprises an input 12 for receiving a test signal from a test signal source 14, which is also referred to as test system in FIG. 1. The input 12 can be connected to a signal line 16. The signal line 16, which is a coaxial line in the system shown in FIG. 1, has a predefined characteristic wave impedance of 50 Ω. To achieve matching, the test system also has an internal resistance 18 of 50 Ω. The inventive test apparatus 10 further comprises branching means 20, which is also designated with point A (Pkt. A). Branching means 20 has a first terminal and generally a plurality of second terminals, wherein the first terminal is connected to input 12 of the test apparatus. The inventive test apparatus further comprises a plurality of distribution lines 22a, 22b, the signal lines being connected to a terminal of the plurality of second terminals of branching means 20 on the input side, respectively, while devices under test 24a (DUT1) and 24b (DUT2) can be connected on the output side at the respective distribution lines. Inventively, each distribution line has a characteristic wave impedance that is generally equal to the product of the predefined characteristic wave impedance, i.e. 50 Ω in the example shown in FIG. 1, and the total number of distribution lines 22a, 22b, i.e. the factor 2 in the embodiment shown in FIG. 1.

By the fact that the characteristic wave impedances of the distribution lines 22a, 22b together equal the characteristic wave impedance of the signal line 16, due to the parallel connection of the distribution lines, signal matching is given at point A, i.e. at branching means 20.

The signal splitting of the test signal on the signal line 16 into the individual signals on the distribution lines thus takes place without amplitude and rise time distortions. Inventively, the signal line 16 is split into several distribution lines with simultaneous increase of the characteristic wave impedance of the distribution lines.

Although, for clarity, merely the case for two devices under test 24a, 24b is illustrated in FIG. 1, it should be noted that the characteristic wave impedance matching can be produced inventively for several devices under test, by setting the characteristic wave impedance of a distribution line equal to n-times the characteristic wave impedance of the signal line 16, when n devices under test should be tested, or when n distribution lines are present, respectively.

Then no signal distortions of the amplitude or rise time occur at the inputs of the devices under test.

In a preferred embodiment of the present invention the distribution lines 22a, 22b are chosen equally long to avoid time shifts between the inputs.

If, for example, four distribution lines are provided for simultaneous testing of four devices under test, the characteristic wave impedance of a distribution line is set to 200 Ω, when the characteristic wave impedance of the signal line is 50 Ω. Alternatively, a test system with an internal resistance of 25 Ω and a signal line with a characteristic wave impedance of 25 Ω can be used. Then, the distribution lines for testing four devices under test merely need to have 100 Ω. When the characteristic wave impedance of the distribution lines is set to 200 Ω, already eight devices under test can be tested simultaneously, without the occurrence of amplitude and signal rise time distortions.

Figure 2:
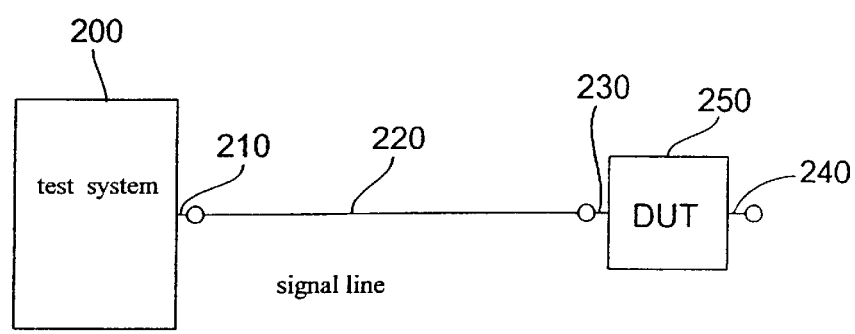
FIG. 2 a known test setup for measuring a single device under test.

In the following, reference will be made to FIGS. 4, 5 and 6. In all figures, the time t is plotted along the abscissa, while a voltage U is illustrated along the ordinate. FIG. 5 shows a signal rise time of a certain test system immediately at the input of the device under test for the case shown in FIG. 2. The interpretation of the diagram of FIG. 5 shows that the test system provides signal edges with a rise time of 1.17 ns.

Figure 3:
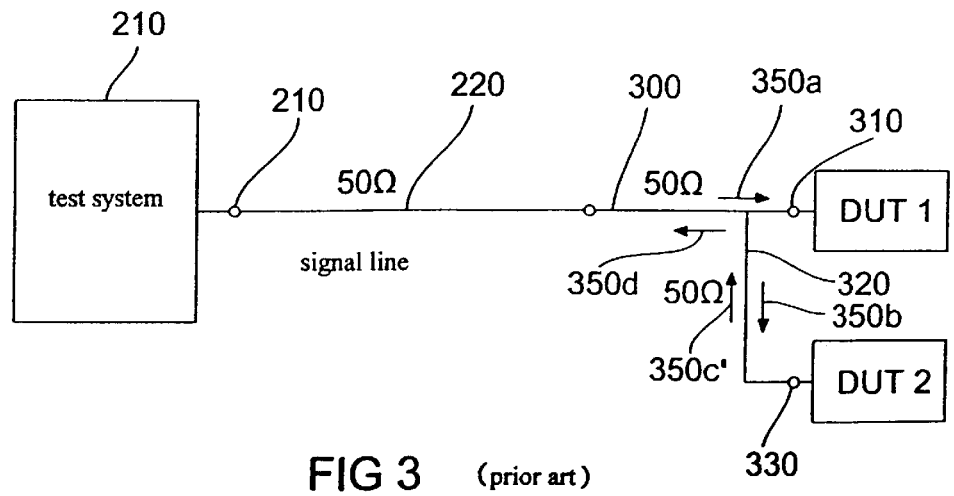
FIG. 3 a known test setup for measuring a plurality of devices under test with the L-shared-arrangement.
Figure 4:
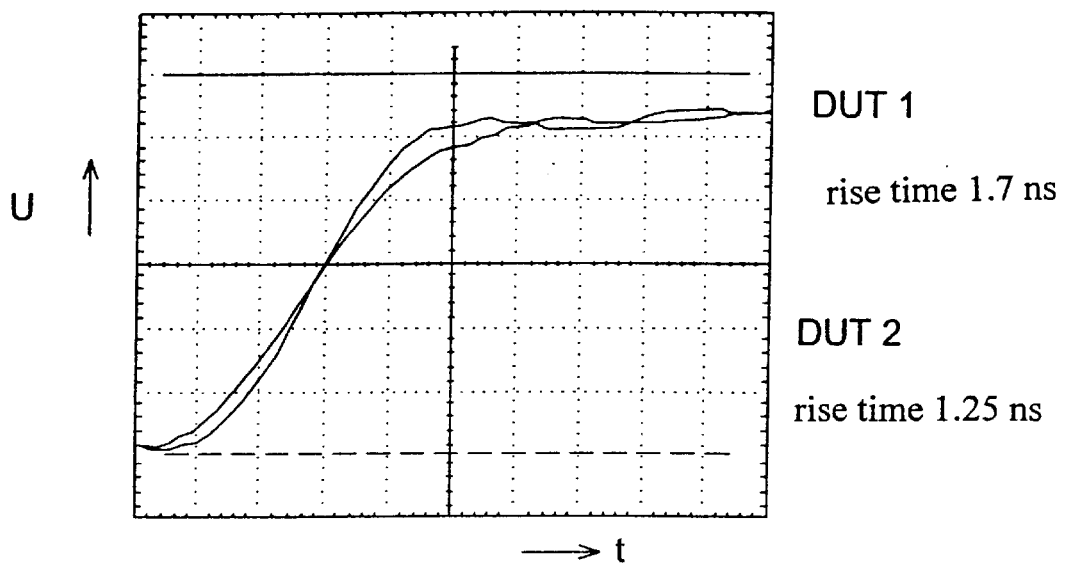
FIG. 4 a comparison of the signal rise times of the first and the second device under test for the known arrangement according to FIG. 3.
Figure 5:
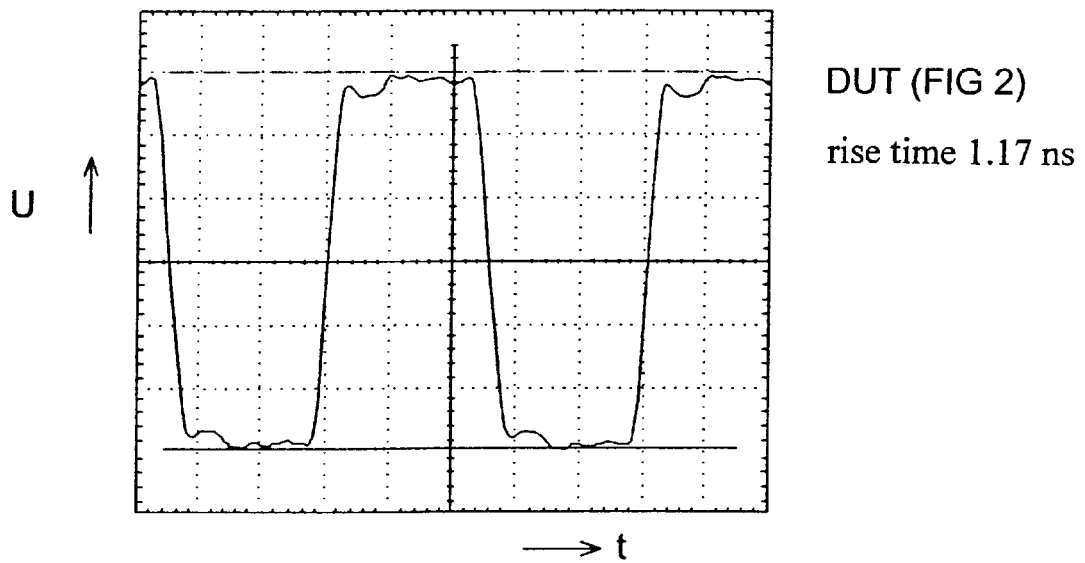
FIG. 5 a graphic illustration for demonstrating the rise time for the system for testing a single device under test for comparison purposes shown in FIG. 2.

FIG. 4 shows the two rise times that occur for the known case shown in FIG. 3 superimposed. While at the DUT2 of FIG. 3 a rise time of 1.25 ns can be determined, the rise time at the DUT1 is already 1.7 ns due to the "staircase function appearance" already discussed in the introduction of the description, which corresponds to a rise of the rise time of about 36% with regard to the rise time of the device under test 2. This significant rise of the rise time, i.e. significant levelling out or flattening of the signal edge, that is only achieved due to the L-shaped test apparatus shown in FIG. 3, immediately leads to error detections of the test systems, such that a DUT1 is detected as defective, although it is alright.

Figure 6:
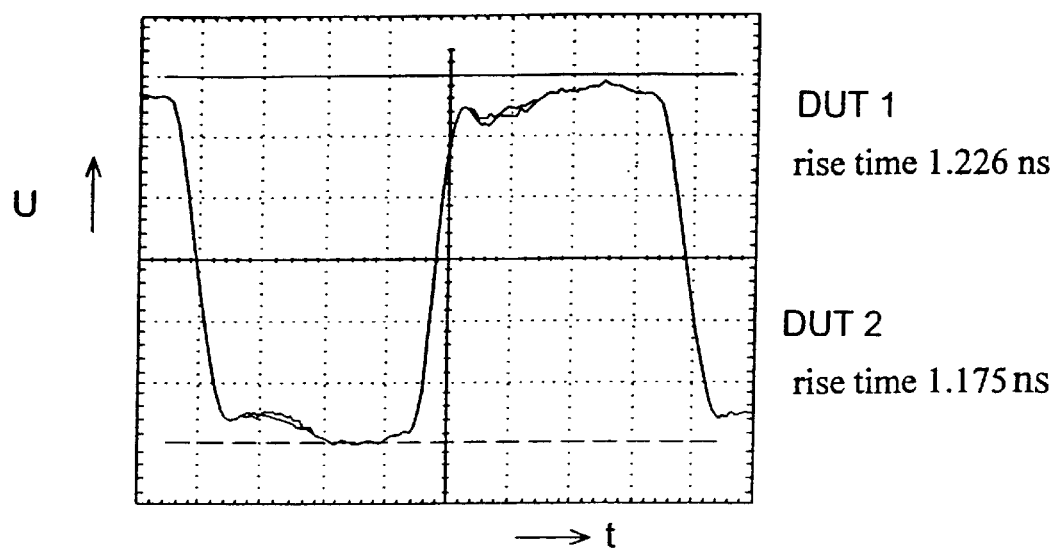
FIG. 6 a common illustration of the wave forms at the inputs of the two devices under test for the inventive test apparatus.

FIG. 6, however, shows the comparison of the rise times of the two devices under test DUT1 and DUT2 for the case shown in FIG. 1. The interpretation of the diagram shows that a rise of 1.226 ns is present at the input of DUT1, while a rise time of 1.175 ns is present at the input of DUT2. This means that the inventive test apparatus leads to the fact that the difference of the two rise times lies in the area of <5% regarding to the smaller rise time of the second device under test, which leads to the fact, that error detection processes with regard to the device under test 1 are significantly rarer or do not occur at all. Further, it should be noted, that a comparison of FIG. 6 with FIG. 5 shows that the inventive splitting of the signal line into a plurality of distribution lines with higher characteristic wave impedance does not lead to a significant rise of the rise time, since the rise times for the inventive test apparatus of FIG. 6 are in the range of the rise time for the case of measuring a single device under test.

In preferred embodiments of the present invention the distribution lines on the contact board 10 are realised as stripe lines, such that branching means implements a transition from a coaxial line to stripe lines, when the signal line is designed as coaxial line, as it illustrated in FIG. 1.

Reference number list 10 test apparatus
12 input of the test apparatus
14 test signal source
16 signal line
18 internal resistance of the test system
20 branching means
22a first distribution line
22b second distribution line
24a first device under test
24b second device under test
200 test system
210 output of test system
220 signal line
230 input of the device under test
240 output of the device under test
250 device under test
300 first subline
310 input of the first device under test
320 second subline
330 input of the second device under test
350a propagating wave on the first subline
350b propagating wave on the second subline
350c back propagating wave on the second subline
350d back propagating wave on the first subline

What is claimed is:

1. Test apparatus for testing devices under test, comprising:
    an input for receiving a test signal from a test signal source, wherein a signal line with a predefined characteristic wave impedance is connectable to the input;
    branching means with a first and a plurality of second terminals, the first terminal being connected to the input; and
    a plurality of distribution lines, each distribution line of the plurality of distribution lines being connected to one of the plurality of second terminals on the input side, and wherein one of the devices under test is connectable to each distribution line on an output side, wherein each distribution line has a characteristic wave impedance which is substantially equal to a product of the predefined characteristic wave impedance and the number of distribution lines.

2. Test apparatus according to claim 1, wherein the input is formed to be able to be connected to a coaxial cable as a signal line.

3. Test apparatus according to claim 1, wherein the distribution lines are strip lines.

4. Test apparatus according to claim 1, wherein the test apparatus is formed as a contact board.

5. Test apparatus according to claim 1, wherein the distribution lines all have the same length.

6. Test apparatus according to claim 1, wherein the predefined characteristic wave impedance of the signal line is 50 Ω or smaller.

7. Test apparatus according claim 1, wherein inputs of the devices under test that are connectable to the distribution lines have a high impedance.

8. Method for transmitting a test signal to devices under test, comprising:
    receiving a test signal from a signal line having a predefined characteristic wave impedance;
    branching the testing signal into a number of branching signals;
    transmitting the branching signals via a number of distribution lines, wherein each distribution line has a characteristic wave impedance that is substantially equal to a product of the predefined characteristic wave impedance and the number of distribution lines.

* * * * *